United States Patent [19]

Mizuno et al.

[11] Patent Number: 5,033,407
[45] Date of Patent: Jul. 23, 1991

[54] LOW PRESSURE VAPOR PHASE GROWTH APPARATUS

[75] Inventors: Shigeru Mizuno, Fuchu; Isamu Morisako, Fukuoka, both of Japan

[73] Assignee: Anelva Corporation, Tokyo, Japan

[21] Appl. No.: 477,255

[22] Filed: Feb. 7, 1990

[30] Foreign Application Priority Data

Feb. 14, 1989 [JP]  Japan .................................. 1-34826

[51] Int. Cl.$^5$ ............................................. C23C 16/00
[52] U.S. Cl. ..................... 118/725; 118/715; 118/724
[58] Field of Search ......................... 118/715, 725, 724

[56] References Cited

U.S. PATENT DOCUMENTS 4,913,929  4/1990  Moslehi .............................. 118/723

FOREIGN PATENT DOCUMENTS 0299244  6/1988  European Pat. Off. .

OTHER PUBLICATIONS

G. Lewin, *Fundamentals of Vacuum Science and Technology*, 1965, pp. 2-10.
P. A. Redman, J. P. Hobson and E. V. Kornelsen, *The Physical Basis of Ultrahigh Vacuum*, 1968, pp. 18-23.

*Primary Examiner*—Richard Bueker
*Attorney, Agent, or Firm*—Edward D. Manzo

[57] ABSTRACT

A low pressure vapor phase growth apparatus is disclosed. The apparatus comprises a window made of a light-transmissive material, a gas feeder for feeding a reactive gas, an exhauster for pumping gases out after a chemical reaction, a lamp for effecting radiant heating of a substrate with a radiation emitted therefrom and transmitted through said light-transmissive window, and a cooling mechanism for forcibly cooling said light-transmissive window. The substrate and the light-transmissive window are maintained in no mutual contact with a gap therebetween having a width of at most the mean free path of a gas existing in the gap. The reactive gas fed through the gas feeder undergoes the chemical reaction on the obverse surface of the substrate to form a thin film thereon.

6 Claims, 2 Drawing Sheets

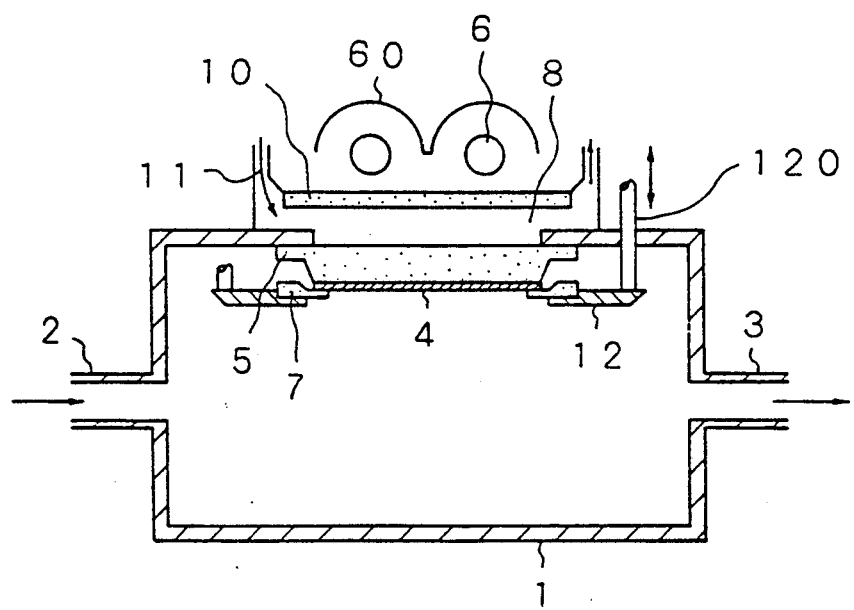
FIG_2

LOW PRESSURE VAPOR PHASE GROWTH APPARATUS

BACKGROUND OF THE INVENTION

1. Field of the Invention

The present invention relates to a low pressure vapor phase growth apparatus for thin film formation on the obverse surface of a substrate under reduced pressure.

2. Description of Prior Art

FIG. 2 is a schematic cross-sectional view of a conventional low pressure vapor phase growth apparatus with a direct substrate-heating system, wherein all members around a substrate 4 are in a rotary symmetrical form.

In this conventional apparatus, the substrate 4 is pressed against and fixed on the obverse surface (lower surface in the figure) of a light-transmissive supporting bed 5 by means of an annular light-transmissive fixing tool 7 provided on the upper side of an annular lifter 12 to be driven either upward or downward with operating bars 120 to be moved from the outside of a reaction chamber 1.

The substrate 4 is radiant-heated, from the reverse surface thereof, with a lamp 6 disposed on the rear side of the light-transmissive supporting bed 5, while a reactive gas is fed into the reaction chamber 1 through a gas feeder 2. The reactive gas undergoes a chemical reaction on the obverse surface (lower surface in the figure) of the substrate 4 to grow a film thereon. The unreacted gas and the resulting formed gas are pumped out through an exhauster 3.

For the purpose of keeping the light-transmissive supporting bed 5 stable at a low temperature, a light-transmissive plate 10 is set to provide a cooling chamber 8 between the plate 10 and the light-transmissive supporting bed 5. A cooling medium (water) 11 is flowed through the cooling chamber 8.

The supply of heat to the substrate 4 in this apparatus is effected only by a radiant energy directed thereto from the lamp 6 because the light-transmissive supporting bed 5 is cooled in a manner as described above.

A factor in determining the uniformities of the thickness and quality of a film being grown on the obverse surface of the substrate 4 is the uniformity of the temperature of the obverse surface of the substrate 4. In order to supply heat stably and uniformly to the substrate 4, the position and symmetry in shape of the lamp 6 as well as the shape of a rear reflective plate 60 must be appropriately designed to secure the symmetry in shape of the above-mentioned cooling chamber 8, the symmetry and uniformity of inflow and outflow of the cooling medium 11, etc.

In the foregoing conventional apparatus, however, there is a problem that the temperature of the substrate 4 is locally lowered around the light-transmissive fixing tool 7 used to fix the substrate 4 on the light-transmissive supporting bed 5 even if the foregoing conditions are all satisfied ideally to uniformize the supply of radiant heat to the substrate 4.

This problem arises totally from large differences in temperature and thermal conductivity between the substrate 4 and the light-transmissive supporting bed 5.

More specifically, since only the substrate 4 is heated and increased in temperature with a radiant energy generated by the lamp 6 and transmitted through the light-transmissive plate 10, the cooling medium (water) 11 and the light-transmissive supporting bed 5, there is an inevitable tendency for a difference in temperature to arise between the substrate 4 and the light-transmissive supporting bed 5. Specifically, the temperature of the substrate 4 is raised much more than that of the light-transmissive supporting bed 5. The difference in temperature between the substrate 4 and the light-transmissive supporting bed 5 is further enhanced because the light-transmissive supporting bed 5 is always cooled as described above. The higher the film-forming temperature on the substrate 4 is set, the larger the above-mentioned difference. Thus, the enlarged difference in temperature increases the heat flow from the reverse surface of the substrate 4 toward the light-transmissive supporting bed 5.

This heat flow is caused totally by two kinds of heat condition: heat conduction via a gas existing between the substrate 4 and the light-transmissive supporting bed 5 and heat conduction via direct contact areas therebetween.

A description will first be made of the "heat conduction via the existing gas." Gaps defined by the microscopically uneven reverse surface of the substrate 4 and the microscopically uneven obverse surface of the light-transmissive supporting bed 5 are generally at most 1 μm in width. Therefore, the gas existing between the substrate 4 and the light-transmissive supporting bed 5 is in a state of molecular flow within the common range of pressure employed in vapor phase growth. Accordingly, the rate of "heat conduction via the existing gas" is proportional to both of the "difference in temperature" between the substrate 4 and the light-transmissive supporting bed 5 and the "number of molecules of the existing gas." This rate of heat conduction is believed to be uniform all over the reverse surface of the substrate 4.

A description will now be made of the "heat conduction via the contact areas" between the substrate 4 and the light-transmissive supporting bed 5. The rate of this kind of heat conduction is proportional to both of the "difference in temperature therebetween" and the "effective contact area." This "effective contact area" is increased in keeping with the increasing contact pressure between the substrate 4 and the light-transmissive supporting bed 5.

The local lowering in the temperature of the substrate 4 around the light-transmissive fixing tool 7 in the conventional apparatus is believed to be caused altogether by a corresponding local rise in the rate of heat flow through the above-mentioned "heat conduction via the contact areas" as a result of an increase in the effective contact area between the substrate 4 and the light-transmissive supporting bed 5 particularly around the light-transmissive fixing tool 7, which increase is brought about by the contact pressure applied by means of the light-transmissive fixing tool 7.

Furthermore, pressing by means of the light-transmissive fixing tool 7 also increases the effective contact area between the fixing tool 7 itself and the substrate 4 to bring about an increase in the heat flow from the substrate 4 to the fixing tool 7, which is also responsible for the local lowering in the temperature of the substrate 4 around the fixing tool 7.

SUMMARY OF THE INVENTION

An object of the present invention is to solve the foregoing problems to thereby provide a low pressure vapor phase growth apparatus capable of realizing a uniform temperature distribution of a substrate to thereby materialize the uniformity of the characteristics of a film grown on the substrate.

In order to attain the above-mentioned object, the apparatus of the present invention has the following structure.

In the low pressure vapor phase growth apparatus comprising a light-transmissive window corresponding to the light-transmissive supporting bed in the conventional apparatus and made of a light-transmissive material (capable of transmitting therethrough a radiation without absorption of the energy thereof), a gas feeder for feeding a reactive gas, an exhauster for pumping gases out after a chemical reaction, a lamp for effecting radiant heating of a substrate with a radiation emitted therefrom and transmitted through the light-transmissive window, and a cooling mechanism for forcibly cooling the light-transmissive window, wherein the reactive gas fed through the gas feeder undergoes the chemical reaction on the obverse surface of the substrate to form a thin film thereon; an improvement is characterized in that the substrate and the light-transmissive window are maintained in no mutual contact with a gap therebetween having a width of at most the mean free path of a gas existing in the gap.

An inert gas is preferably used as the gas existing in the above-mentioned gap.

In the foregoing low pressure vapor phase growth apparatus of the present invention, the substrate is heated and raised in temperature directly with the radiation emitted from the lamp disposed on the rear side of the light-transmissive window just like in the conventional apparatus. Since the light-transmissive window being cooled and the substrate have no mutual contact areas, however, the heat flow from the substrate to the light-transmissive window is caused altogether through "heat conduction via gas" existing therebetween. Accordingly, the uniformity of the temperature distribution of the substrate is substantially secured when the heat conduction via the gas is effected uniformly in the radial directions of the substrate.

As is well known, the rate of heat flow through "heat conduction via the gas" is proportional to both of the difference in temperature between the substrate and the light-transmissive window and the number of molecules of the gas existing in the gap therebetween and is independent of the distance between the substrate and the light-transmissive window (the width of the gap) when the distance between the substrate and the light-transmissive window is about the same as or smaller than the mean free path of the gas to bring the gas into a state of molecular flow.

In such a case, therefore, some nonuniformity of the width of the gap between the substrate and the light-transmissive window does not matter at all, and hence there are no fears of any substantial nonuniform rate of heat flow. Thus, the temperature distribution of the substrate is maintained uniform all across the surface thereof.

BRIEF DESCRIPTION OF THE DRAWINGS

The foregoing and other objects and advantages of the present invention will be better understood by reference to the following description taken in connection with the accompanying drawing, in which FIG. 2 is a schematic cross-sectional view of a conventional low pressure vapor phase growth apparatus.

PREFERRED EMBODIMENT OF THE INVENTION

Figure 1:
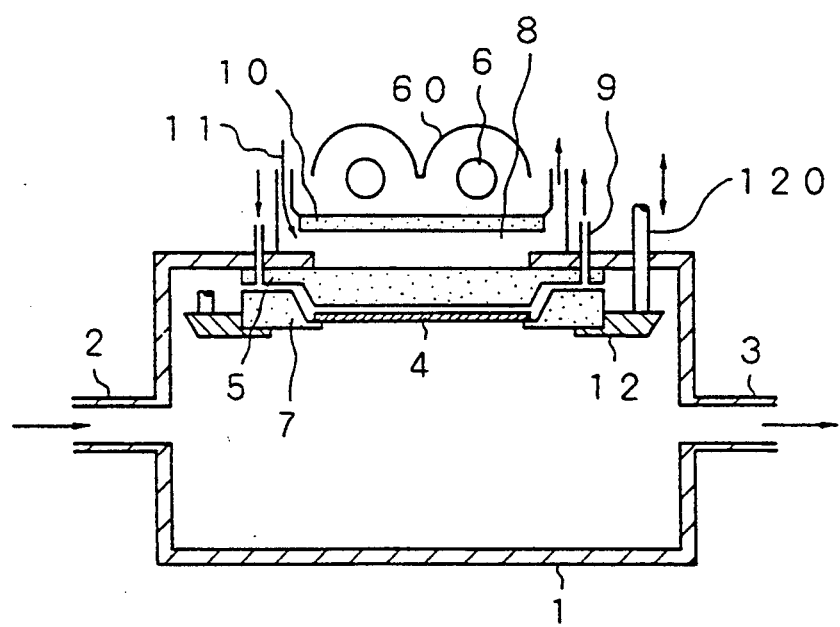
FIG. 1 is a schematic cross-sectional view of an example of the low pressure vapor phase growth apparatus of the present invention.

FIG. 1 is a schematic cross-sectional view of an example of the low pressure vapor phase growth apparatus of the present invention. In FIG. 1, the same reference numerals as in FIG. 2 denote substantially the same constitutional members as in FIG. 2.

Like in FIG. 2, a substrate 4 is softly placed, with the obverse surface thereof directed downward, on an annular light-transmissive fixing tool 7 provided on the upper side of an annular lifter 12 to be driven either upward or downward by means of operating bars 120 to be moved from the outside of a reaction chamber 1. The substrate 4 and a light-transmissive window 5 are maintained in no mutual contact. The width of a gap between the substrate 4 and the window 5 is set to be about the same as or smaller than the mean free path of a gas existing in gap.

More specifically, when the gas existing in the gap is Ar with a pressure of 0.1 Torr by way of example, the gas between the substrate 4 and the light-transmissive window 5 is set to be at most about 1 mm in width even in the widest areas thereof because the mean free path of Ar atoms is about 1 mm.

It is ideal to use as the gas existing in the gas a purge gas such as the above-mentioned Ar gas with the aim of preventing a film from growing on the reverse surface of the substrate 4. The apparatus as shown in FIG. 1 is provided with gas feed inlets 9 capable of feeding therethrough a purge gas into the gap between the light-transmissive window 5 and the substrate 4 as well as light-transmissive fixing tool 78. Conceivable examples of the purge gas to be used in the gap include not only the above-mentioned Ar gas but also other inert gases such as He and Ne gases. In any case, it is necessary that the distance between the substrate 4 and the light-transmissive window 5 be set to be at most the mean free path of a gas through calculation thereof.

In this example, the substrate 4 is placed on the fixing tool 7 just like in the conventional apparatus. Although the contact of the substrate 4 with the fixing tool 7 causes escape of some heat from the substrate 4 to the fixing tool 7, the effective contact area is by far smaller than that in the conventional apparatus because the fixing tool 7 is not pressed against the substrate 4 unlike in the conventional apparatus. This greatly decreases the heat flow from the substrate 4 to the fixing tool 7 through the contact therebetween as compared with the conventional apparatus. Therefore, the contact between the substrate 4 and the fixing tool 7 does not appreciably spoil the uniformity of the temperature distribution of the substrate 4.

The procedure of vapor phase growth on the substrate 4 under reduced pressure is the same as in the conventional apparatus. Specifically, the substrate 4 is heated with a radiant energy from the lamp 6 disposed on the rear side thereof, while feeding thereonto a reactive gas through a gas feeder 2. Thus, a film is grown on the obverse surface of the substrate 4. The unreacted gas and the resulting formed gas are pumped out through an exhauster 3. Like in the conventional apparatus, the light-transmissive window 5 is cooled with a cooling medium 11 flowing through a cooling chamber 8 to keep the light-transmissive window 5 stably at a low temperature.

In the apparatus of this example, the aforementioned problem of the conventional apparatus that the temperature of the substrate 4 is locally lowered around the light-transmissive fixing tool 7 is substantially eliminated to secure an extremely uniform temperature distribution of the substrate 4.

The apparatus of the present invention further produces a secondary effect of remarkably improving the efficiency of heating the substrate 4 since the substrate 4 and the light-transmissive supporting bed 5 are in no mutual contact to decrease the heat flow therebetween.

As described above, the low pressure vapor phase growth apparatus of the present invention provides a uniform temperature distribution of a substrate to secure a uniform vapor phase grown film.

What is claimed is:

1. A low pressure vapor phase growth apparatus comprising a window made of a light-transmissive, energy-conductive material, a gas feeder for feeding a reactive gas, an exhauster for pumping gases out after a chemical reaction, a lamp for effecting radiant heating of a substrate with radiation emitted therefrom and transmitted through the light-transmissive, energy-conductive window, and a cooling mechanism for forcibly cooling said light-transmissive, energy-conductive window;

wherein said substrate and said light-transmissive, energy-conductive window are spaced apart with a gap therebetween having a width of at most the mean free path of an inert gas existing in said gap;

wherein said gas feeder is positioned so that reactive gas fed through said gas feeder undergoes said chemical reaction on the obverse surface of said substrate to form a thin film thereon; and wherein said cooling mechanism comprises a liquid which flows across the gap between said substrate and said light-transmissive, energy-conductive window.

2. A low pressure vapor phase growth apparatus as claimed in claim 1, wherein an inert gas is used as said gas existing in said gap.

3. A low pressure vapor phase growth apparatus comprising a chamber for processing a substrate on which a thin film is to be established comprising;

(a) a window comprising a high-transmissive material to permit radiant energy to pass therethrough and onto the reverse surface of said substrate;

(b) a fixing tool comprising a light transmissive material for supporting said substrate;

(c) a gas feeder for feeding a reactive gas into said chamber;

(d) an exhauster for pumping gases out of said chamber;

(e) a source directing radiation through said window onto said reverse surface of substrate;

(f) a cooling mechanism for forcibly cooling said window; and (g) a gas feed inlet for feeding therethrough a purge gas into a gap between said substrate and said window as well as said fixing tool;

wherein said substrate and said window do not contact each other in order not to form a thin film on the reverse surface of said substrate; and wherein a thin film is formed on the obverse surface of said substrate by said reactive gas reacting chemically thereon.

4. The apparatus of claim 3 wherein said purge gas is a member of the group consisting of He, Ar, Ne and $N_2$.

5. The apparatus of claim 3 wherein said light transmissive material is transparent quartz.

6. The apparatus of claim 3 wherein said gap does not exceed the mean free path of said purge gas located with said gap.

* * * * *

UNITED STATES PATENT AND TRADEMARK OFFICE
CERTIFICATE OF CORRECTION

PATENT NO. : 5,033,407

DATED : July 23, 1991

INVENTOR(S) : Mizuno et al

It is certified that error appears in the above-identified patent and that said Letters Patent is hereby corrected as shown below:

The title page showing the illustrative figure should be deleted to be replaced with the attached title page.

United States Patent [19]

Mizuno et al.

[11] Patent Number: 5,033,407
[45] Date of Patent: Jul. 23, 1991

[54] LOW PRESSURE VAPOR PHASE GROWTH APPARATUS

[75] Inventors: Shigeru Mizuno, Fuchu; Isamu Morisako, Fukuoka, both of Japan

[73] Assignee: Anelva Corporation, Tokyo, Japan

[21] Appl. No.: 477,255

[22] Filed: Feb. 7, 1990

[30] Foreign Application Priority Data

Feb. 14, 1989 [JP] Japan .................... 1-34826

[51] Int. Cl.⁵ ............................ C23C 16/00
[52] U.S. Cl. .................... 118/725; 118/715; 118/724
[58] Field of Search .................. 118/715, 725, 724

[56] References Cited

U.S. PATENT DOCUMENTS 4,913,929 4/1990 Moslehi ............................ 118/723

FOREIGN PATENT DOCUMENTS 0299244 6/1988 European Pat. Off. .

OTHER PUBLICATIONS

G. Lewin, *Fundamentals of Vacuum Science and Technology*, 1965, pp. 2-10.
P. A. Redman, J. P. Hobson and E. V. Kornelsen, *The Physical Basis of Ultrahigh Vacuum*, 1968, pp. 18-23.

Primary Examiner—Richard Bueker
Attorney, Agent, or Firm—Edward D. Manzo

[57] ABSTRACT

A low pressure vapor phase growth apparatus is disclosed. The apparatus comprises a window made of a light-transmissive material, a gas feeder for feeding a reactive gas, an exhauster for pumping gases out after a chemical reaction, a lamp for effecting radiant heating of a substrate with a radiation emitted therefrom and transmitted through said light-transmissive window, and a cooling mechanism for forcibly cooling said light-transmissive window. The substrate and the light-transmissive window are maintained in no mutual contact with a gap therebetween having a width of at most the mean free path of a gas existing in the gap. The reactive gas fed through the gas feeder undergoes the chemical reaction on the obverse surface of the substrate to form a thin film thereon.

6 Claims, 2 Drawing Sheets

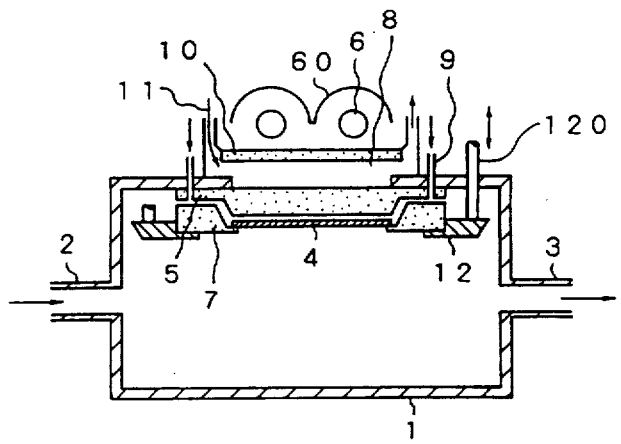

UNITED STATES PATENT AND TRADEMARK OFFICE
CERTIFICATE OF CORRECTION

PATENT NO. : 5,033,407

DATED : July 23, 1991

INVENTOR(S) : Shigeru Mizuno and Isamu Morisako

It is certified that error appears in the above-identified patent and that said Letters Patent is hereby corrected as shown below:

In the Drawings:
Figure 1, change

"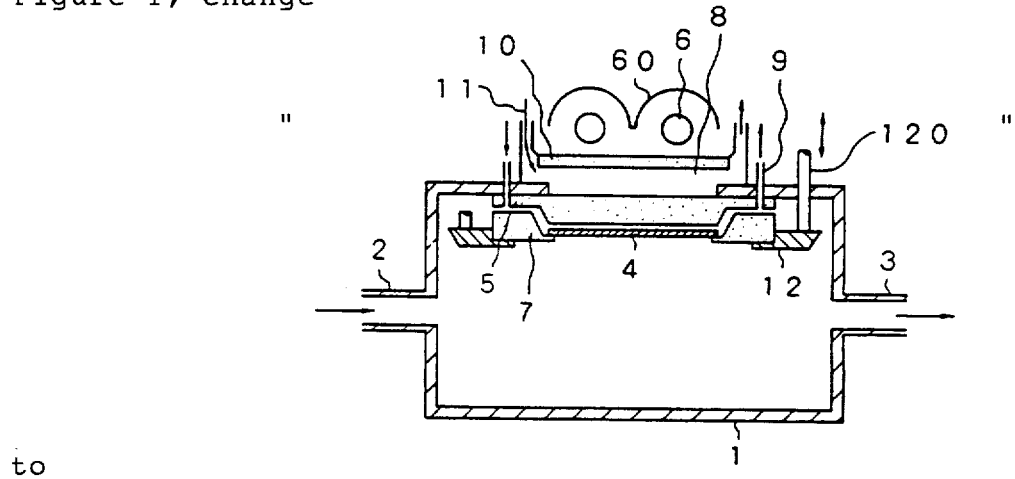"

to

--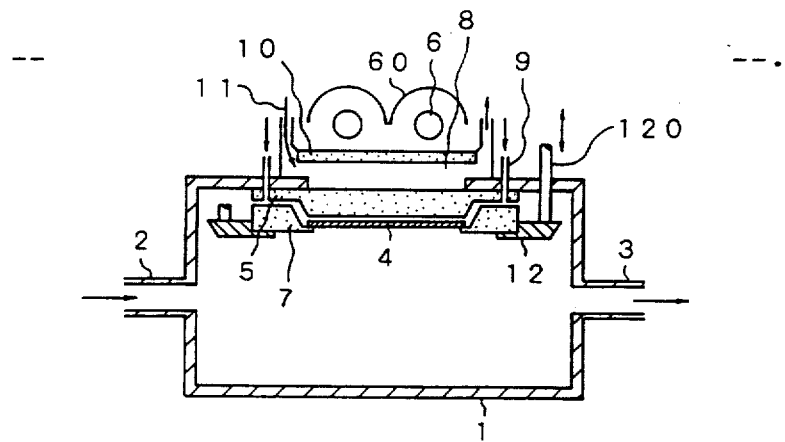--.

UNITED STATES PATENT AND TRADEMARK OFFICE
CERTIFICATE OF CORRECTION

PATENT NO. : 5,033,407
DATED : July 23, 1991
INVENTOR(S) : Shigeru Mizuno and Isamu Morisako It is certified that error appears in the above-identified patent and that said Letters Patent is hereby corrected as shown below:

Col. 2, line 16, change "condition" to --conditions--.

Col. 4, line 24, change "gas" to --gap--.

Col. 4, line 28, change "gas" (second occurrence) to --gap--.

Col. 4, line 35, delete "8".

Col. 4, line 48, change "unlike" to --as--.

Signed and Sealed this

Thirteenth Day of April, 1993

Attest:

STEPHEN G. KUNIN

*Attesting Officer*   *Acting Commissioner of Patents and Trademarks*